US006917698B2

(12) United States Patent
Obi

(10) Patent No.: US 6,917,698 B2
(45) Date of Patent: Jul. 12, 2005

(54) METHOD FOR ALIGNING TWO OBJECTS, METHOD FOR DETECTING SUPERIMPOSING STATE OF TWO OBJECTS, AND APPARATUS FOR ALIGNING TWO OBJECTS

(75) Inventor: Hiroki Obi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 630 days.

(21) Appl. No.: 09/986,287

(22) Filed: Nov. 8, 2001

(65) Prior Publication Data
US 2002/0054209 A1 May 9, 2002

(30) Foreign Application Priority Data

Nov. 9, 2000 (JP) ........................................ 2000-341265

(51) Int. Cl.[7] ................................................ G06K 9/00
(52) U.S. Cl. ...................... 382/151; 348/95; 250/491.1; 250/559.3
(58) Field of Search ................................. 382/141, 146, 382/151, 286, 287, 165, 199, 291; 348/87, 95, 125, 126; 250/559.3, 491.1; 356/399

(56) References Cited

U.S. PATENT DOCUMENTS 6,002,426 A * 12/1999 Back et al. ................... 348/87

FOREIGN PATENT DOCUMENTS

JP 59-17260 1/1984
JP 5-13518 1/1993

* cited by examiner

Primary Examiner—Bhavesh M. Mehta
Assistant Examiner—John Strege
(74) Attorney, Agent, or Firm—Oblon, Spivak, McClelland, Maier & Neustadt, P.C.

(57) ABSTRACT

Disclosed is a case where an aligning method according to the present invention is applied to a probe apparatus. Target probes are photographed by an upper CCD camera and target electrode pads are photographed by a lower CCD camera. Second virtual images of the photographed probes and first virtual images of the electrode pads are displayed in second and first image data areas on a monitor screen. Dark and light colors in terms of brightness are applied to pixels of the second virtual image and the first virtual image. The second virtual images are moved on the monitor screen, so that the second virtual images are superimposed on the first virtual images. The total sum of the brightness (luminance) of all the first virtual images is calculated. On the basis of the calculated luminance value, a position where the target probes are most successfully brought into contact with the target pads is detected.

24 Claims, 5 Drawing Sheets

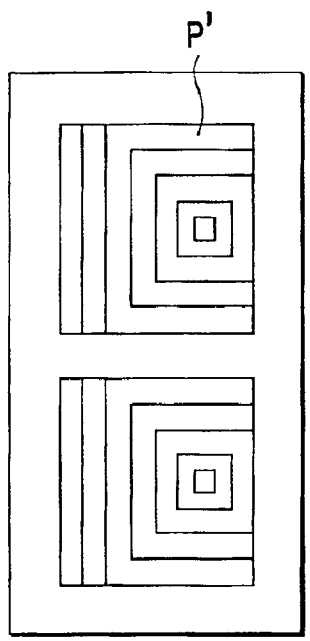 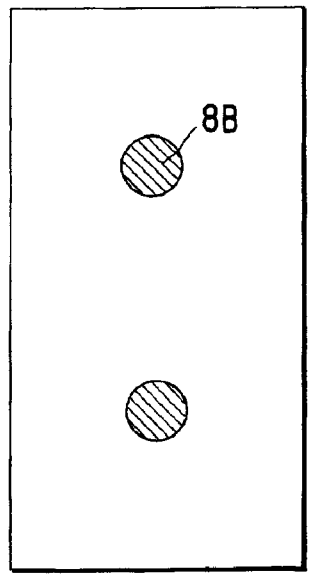 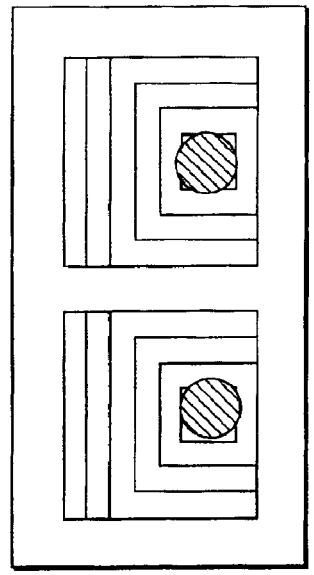
FIG. 7A  FIG. 7B  FIG. 7C
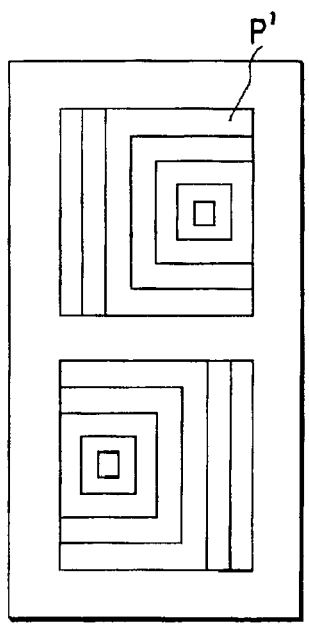 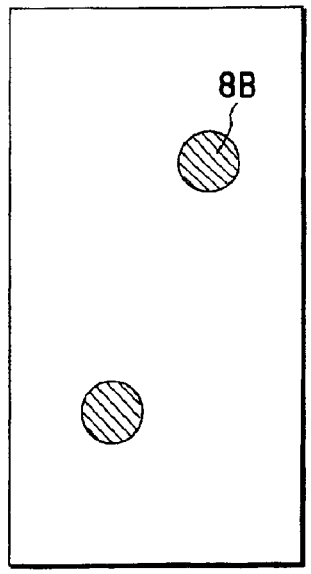 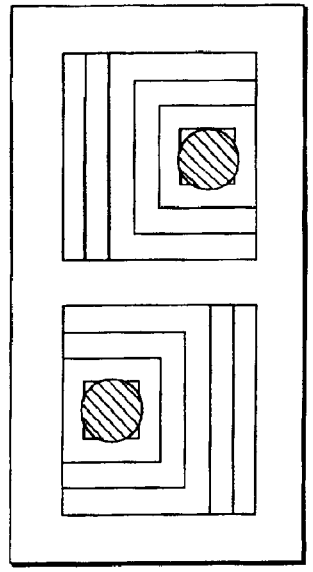
FIG. 8A  FIG. 8B  FIG. 8C

METHOD FOR ALIGNING TWO OBJECTS, METHOD FOR DETECTING SUPERIMPOSING STATE OF TWO OBJECTS, AND APPARATUS FOR ALIGNING TWO OBJECTS

CROSS-REFERENCE TO RELATED APPLICATIONS

This application is based upon and claims the benefit of priority from the prior Japanese Patent Application No. 2000-341265, filed Nov. 9, 2000, the entire contents of which are incorporated herein by reference.

BACKGROUND OF THE INVENTION

1. Field of the Invention

The present invention relates to a method for aligning two objects, a method for detecting a superimposing state of two objects, and an apparatus for aligning two objects. For example, in a probe apparatus, in order to inspect the electric characteristics of an object to be inspected, it is necessary to allow a plurality of electrodes of the inspected object such as a wafer to electrically come into contact with a plurality of contacts (referred to as probes) of a probe card. The present invention relates to a method for aligning the respective electrodes of the inspected object with the respective contacts to realize the contact.

2. Description of the Related Art

Referring to FIGS. 6A and 6B, for example, the probe apparatus comprises a loader chamber 1 to/from which a wafer is delivered and a prober chamber 2 in which the electric characteristics of the wafer delivered from the loader chamber 1 is inspected. The loader chamber 1 comprises a cassette setting portion 3 on which a cassette C receiving a wafer W therein is set, a delivery mechanism (fork) 4 for delivering the wafer W to the loader chamber 1, and a sub chuck 5 for pre-aligning the wafer on the basis of the orientation plane of the wafer while the fork 4 delivers the wafer. The prober chamber 2 includes a setting table (hereinbelow, referred to as main chuck) 6 on which the pre-aligned wafer is set and which is moved in X, Y, Z, and θ directions, a mechanism (alignment mechanism) 7 for accurately positioning the wafer on the main chuck 6, and a probe card 8 having probes 8A. The probe card 8 is fixed to a head plate 2A arranged on the top of the prober chamber 2.

As shown in FIGS. 6A and 6B, the alignment mechanism 7 has a lower CCD camera 7A and an upper CCD camera 7B. The alignment mechanism 7 is controlled by a control device (not shown). The lower CCD camera 7A is provided for the main chuck 6. The lower CCD camera 7A photographs the probes 8A of the probe card 8 from the underside. The upper CCD camera 7B is arranged on the center of an alignment bridge 7C. The upper CCD camera 7B photographs the wafer W on the main chuck 6 from the above side. The photographed images of the probes 8A and wafer W are displayed on a monitor screen 9A of a display device 9. The alignment bridge 7C is moved from the inmost portion (the upper portion in FIG. 6B) of the prober chamber 2 to a probe center along a pair of guide rails 7D arranged in the Y direction in the upper portion of the prober chamber 2. The main chuck 6 has a target 7E which is movable above the lower CCD camera 7A. The optical axis of the lower CCD camera 7A matches the optical axis of the upper CCD camera 7B through the target 7E. The position of the main chuck 6 upon matching is used as a reference position for alignment of the wafer W and the probes 8A.

The prober chamber 2 has a rotatable test head T. The test head T is electrically connected to the probe card 8 through an interface portion (not shown). A signal for inspection is transmitted from a tester to electrode pads of the wafer via the test head T and the probes 8A.

The alignment of the probes 8A of the probe card 8 and the electrode pads of the wafer W will now be described. The upper CCD camera 7B and the lower CCD camera 7A photograph a plurality of probes 8A as targets for alignment (hereinbelow, referred to as target probes) and a plurality of electrode pads corresponding thereto (hereinbelow, referred to as target electrode pads). The optical axis of the upper CCD camera 7B arranged at the center of the probes is allowed to match the optical axis of the lower CCD camera 7A fixed to the main chuck through the target 7E. The position at that time is set to the reference position of the main chuck 6. On the basis of the position coordinates of each target probe 8A and the reference position coordinates in the photographing position, the amount of deviation between the target probe 8A and the reference position is calculated. Similarly, the amount of deviation between each target electrode pad and the reference position is also calculated. On the basis of the deviation amounts of the plurality of target electrode pads from the reference position, the position coordinates where the target probes 8A match the target pads are calculated. The main chuck 6 is moved on the basis of the calculation results to align the target probes 8A with the target electrode pads.

In conventional aligning methods, however, on the basis of position data of the target probes 8A, the position data of the target electrode pads, and the reference position of the main chuck 6, and the amount to move the main chuck 6 has to be obtained for every target probe and every target pad. Accordingly, the calculation process is complicated. In association with the super integration of devices, the desired alignment precision becomes higher. Consequently, the calculation for alignment becomes more complicated, so that the throughput of the inspection is deteriorated.

BRIEF SUMMARY OF THE INVENTION

According to a first aspect of the present invention, there is provided a method for moving a main chuck on which first objects are set in X, Y, Z, and θ directions to align the first objects with second objects arranged above the first objects. The method includes:

(a) photographing the second objects through second photographing means to obtain second photographed images;

(b) displaying second virtual data images in a second image data area on a monitor screen of a display device on the basis of the second photographed images of the second objects;

(c) allowing an optical axis of the second photographing means to match an optical axis of first movable photographing means to obtain a reference position of the main chuck;

(d) moving the main chuck to align the first objects with the first photographing means and then photographing the first objects through the first photographing means to obtain first photographed images;

(e) displaying first virtual data images of the first photographed images in a first image data area on the monitor screen of the display device on the basis of design data of the first objects;

(f) relatively moving the first virtual data images and the second virtual data images on the monitor screen to superimpose both the virtual data images on each other; and (g) determining a position where both the virtual data images are most fitly superimposed on each other as an alignment position of the first and second objects.

In the aligning method, preferably, the second photographing means is provided for the main chuck.

In the aligning method, preferably, the first objects are a plurality of electrode pads formed on an object to be inspected and the second objects are a plurality of contacts to electrically come into contact with the electrode pads.

In the aligning method, preferably, the second virtual data images of the contacts in the (b) are displayed with a color having a uniform density; in the (d), the electrode pads to be photographed by the first photographing means are reference electrodes for alignment among the plurality of electrode pads formed on the object to be inspected; in the (e), the first virtual data images of the electrode pads are displayed with dark and light colors; and in the (f), a position where an image density is most changed due to the superimposition of the first virtual data image and the second virtual data image is set to a position where both the virtual data images are superimposed on each other so that both the images are most fitly superimposed on each other.

According to a second aspect of the present invention, there is provided a method for aligning a plurality of electrode pads arranged on an object to be inspected with a plurality of contacts formed on a probe card. The method includes:

(a) photographing predetermined electrode pads among the electrode pads through first photographing means to obtain first photographed images;

(b) displaying first virtual data images corresponding to the predetermined electrode pads in a first image data area on a monitor screen of a display device on the basis of the first photographed images and design data of the predetermined electrode pads, the first virtual data images being colored and the color denoting either of a color having a uniform density and a color having a distributed density;

(c) photographing the contactors through second photographing means to obtain second photographed images;

(d) displaying second virtual data images of the contactors corresponding to the second photographed images in a second image data area on the monitor screen of the display device, the second virtual data images being colored and the color denoting either of a color having a distributed density and a color having a uniform density;

(e) relatively moving the first virtual data images and the second virtual data images on the monitor screen to superimpose both the virtual data images on each other and then measuring the luminance of each portion where both the virtual data images are superimposed on each other;

(f) detecting a superimposing state of the first virtual data image and the second virtual data image on the basis of the luminance measured in the (e);

(g) detecting a distance relatively traveled by the virtual data images until the superimposition of the first and second virtual data images is set to a predetermined state according to the (f); and (h) relatively moving the electrode pads and the contactors on the basis of the traveled distance to align the pads with the contactors.

In the aligning method, preferably, the luminance to be measured is a change in luminance.

In the aligning method, preferably, in the (f), the superimposing state of the first and second virtual data images is detected on the basis of a comparison of the measured luminance with a predetermined luminance value.

In the aligning method, preferably, in the (f), the superimposing state of the first virtual data images and the second virtual data images is grasped on the basis of a detection result indicating that the measured luminance denotes one of a maximum value and a minimum value.

In the aligning method, preferably, in the (d), each second virtual data image formed in the second image data area is one of an image obtained by enlarging a photographed image of each contact and an image obtained by reducing the photographed image.

In the aligning method, the predetermined electrode pads in the (a) are all of the electrode pads on the object to be inspected, and the contactors in the (c) are the contactors corresponding to all of the electrode pads.

In the aligning method, the predetermined electrode pads among the electrode pads in the (a) are reference electrodes for alignment.

According to a third aspect of the present invention, there is provided a method for detecting a superimposing state of first objects and second objects arranged so as to face the first objects. The method includes:

(a) photographing the first objects through first photographing means to obtain first photographed images;

(b) forming first virtual data images corresponding to the first objects in a first image data area on a monitor screen of a display device on the basis of the first photographed images and design data of the first objects, the first virtual data images being colored and the color denoting either of a color having a uniform density and a color having a distributed density;

(c) photographing the second objects through second photographing means to obtain second photographed images;

(d) forming second virtual data images corresponding to the second objects in a second image data area on the monitor screen of the display device on the basis of the photographed images of the second objects, the second virtual data images being colored and the color denoting either of a color having a distributed density and a color having a uniform density;

(e) relatively moving the first virtual data images and the second virtual data images on the monitor screen to superimpose both the virtual data images on each other and then measuring the luminance of each superimposing portion; and (f) detecting a superimposing state of the first virtual data images and the second virtual data images on the basis of the luminance value measured in the (e)

In the detecting method, preferably, the first objects are a plurality of reference marks arranged in predetermined positions on a substrate and the second objects are a plurality of contactors formed on a probe card.

According to a fourth aspect of the present invention, there is provided a method for moving a main chuck on which a first object is set in X, Y, Z, and θ directions to align the first object with second objects arranged above the first object. The method includes:

(a) photographing the first object;

(b) photographing the second objects;

(c) forming image data of the first object on the basis of photographing data of the photographed first object;

(d) forming image data of the second objects on the basis of photographing data of the photographed second objects;

(e) applying dark and light portions to images of the first and second image data;

(f) relatively moving the image data of the first object and the image data of the second objects, to which the dark and light portions are applied, to superimpose both images on each other;

(g) detecting at least one of a position having the lowest luminance and a position having the highest luminance on the basis of the luminance of the superimposed images; and (h) moving the first object and the second objects on the basis of the detected luminance value to align both the objects with each other.

In the aligning method, preferably, the first object is a wafer, the first images are a plurality of electrode pads formed on the wafer, and the second objects are a plurality of probes to be brought into contact with the electrode pads.

According to the present invention, there are provided apparatuses corresponding to the methods according to the first, second, third, and fourth aspects of the present invention.

Other objects and advantages of the present invention will be explained in the following description in the specification and a part thereof will become apparent from the disclosure or will be obtained upon employment of the present invention in practice. The objects and advantages of the present invention will be realized and obtained by combining means particularly indicated in the description.

BRIEF DESCRIPTION OF THE SEVERAL VIEWS OF THE DRAWING

FIGS. 7A–7C show an example of the monitor screen in the second state where dark and light colors (colors having distributed densities) are applied to an image, FIG. 7A showing an image of a plurality of electrode pads, FIG. 7B showing an image of a plurality of probes, and FIG. 7C illustrating a state where the two images are superimposed on each other; and FIGS. 8A–8C show an example of the monitor screen in the third state where dark and light colors (colors having distributed densities) are applied to an image, FIG. 8A showing an image of a plurality of electrode pads, FIG. 8B showing an image of a plurality of probes, and FIG. 8C illustrating a state where the two images are superimposed on each other.

DETAILED DESCRIPTION OF THE INVENTION

The present invention relates to a method for aligning two objects and a method for detecting a superimposing state of two objects. In order to more specifically explain the present invention, the present invention will now be described on the basis of a case where the present invention is applied to a probe apparatus capable of being used for inspection of IC chips formed on a semiconductor wafer. The present invention is not limited to the applications of the probe apparatus as stipulated in the claims. The "two objects" in the present invention are not limited to a target electrode pad formed on a semiconductor wafer and a target probe of a probe card. The "two objects" include any object which needs to be aligned, for example, an object to be inspected and an inspection part.

Figure 5A:
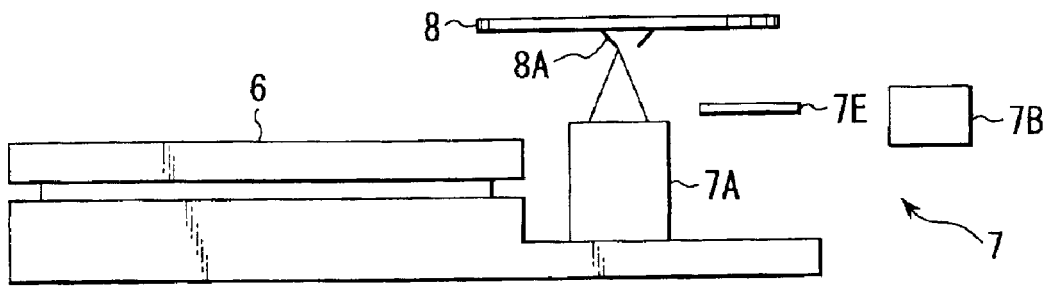
FIGS. 5A, 5B, and 5C are explanatory diagrams showing the operation of an alignment mechanism when an aligning method according to the present invention is performed, FIG. 5A showing a state where a lower CCD camera photographs the probes, FIG. 5B showing a state where the optical axis of the lower CCD camera matches the optical axis of an upper CCD camera, and FIG. 5C showing a state where the upper CCD camera photographs the electrode pads of a wafer.

The present invention will now be described on the basis of a first embodiment shown in FIGS. 1 to 5C. Since the probe apparatus can be constituted similar to the apparatus shown in FIGS. 6A and 6B, the same and corresponding portions of the apparatus as those of the apparatus shown in FIGS. 6A and 6B are designated by the same reference numerals. The aligning method according to the present embodiment can be performed by using the alignment mechanism 7 controlled by a control device (not shown).

Figure 1:
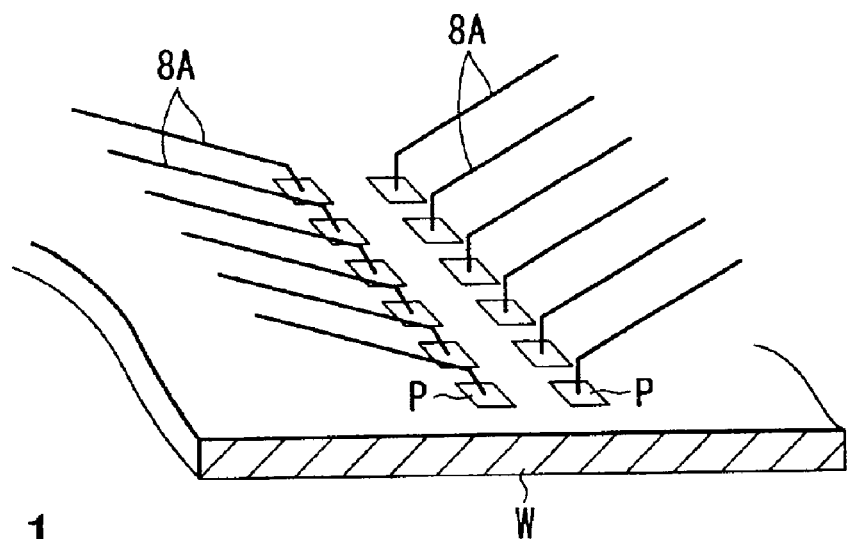
FIG. 1 is a schematic diagram showing in enlarged dimension a state in which a plurality of probes are come into contact with a plurality of electrode pads.

Referring to FIG. 1, first objects (for example, objects to be inspected such as the plurality of electrode pads P of IC chips formed on the semiconductor wafer W) are electrically brought into contact with second objects (for example, the plurality of probes 8A of the probe card 8). In the contact state, the electric characteristics of the IC chip(s) on the wafer are inspected.

In an image processing in the present embodiment, image processing software for alignment can be used. According to the image processing software, on the basis of first photographed images obtained by photographing the first objects (e.g., electrode pads), second photographed images obtained by photographing the second objects (e.g., contacts), and design data, first virtual images of the electrode pads and second virtual images of the probes can be displayed in first and second image data areas on the monitor screen 9A (FIGS. 2A and 2B) of the display device 9 (FIG. 6A). According to the image processing software, dark and light colors (color having distributed densities) can be applied to the first virtual images of the electrode pads and the second virtual images of the probes. Furthermore, according to the image processing software, both of the virtual images can be relatively moved on the monitor screen. Due to the relative motion, the virtual images can be superimposed on the other virtual images on the monitor screen. Moreover, the image processing software can be constructed so as to calculate the luminance of the monitor screen, particularly, the luminance in the portion where each virtual image is superimposed on the other virtual image. Further, the image processing software can also be constructed so that the maximum value or minimum value of the luminance can be determined.

Figures 2A, 2B:
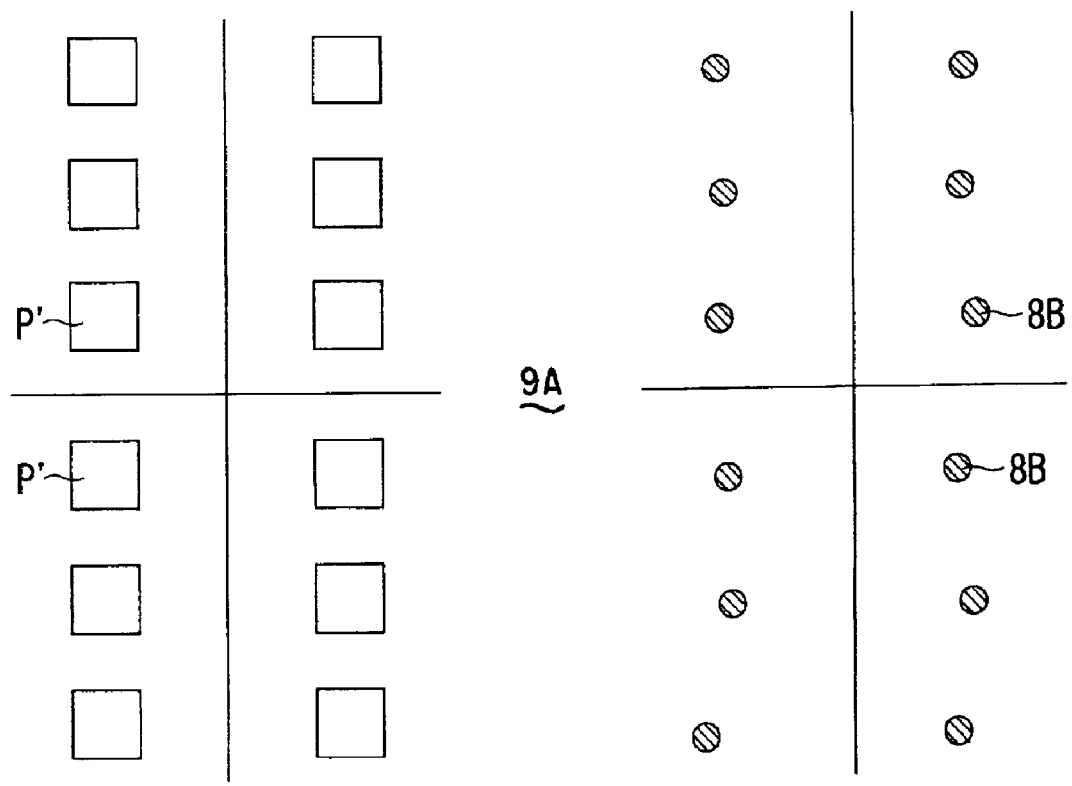
FIGS. 2A and 2B show examples of virtual images displayed on image data areas on a monitor screen in a process of performing a method according to the present invention, FIG. 2A showing first virtual images of first objects (e.g., electrode pads) and FIG. 2B showing second virtual images of second objects (e.g., probes of a probe card)

The aligning method according to the first embodiment of the present invention will now be described. The aligning method according to the present embodiment can be controlled by the control device (not shown). For example, as shown in FIG. 5A, the main chuck 6 is moved in the X and Y directions, so that second image photographing means (hereinbelow, referred to as a "lower CCD camera") 7A is positioned below the probe card 8. The lower CCD camera 7A photographs the probes 8A of the probe card 8. According to the present embodiment, for example, the probes for alignment of the probe card 8 are photographed. As the probes for alignment, for example, three probes located in each of the four corners of the probe card can be selected. The number of probes to be selected is arbitrarily set. All the probes of the probe card can also be selected. The main chuck 6 is moved upward in the Z direction, so that the lower CCD camera 7A focuses the top ends of the three probes 8A in each of the four corners. The lower CCD camera 7A photographs the top ends of the probes 8A to obtain the second photographed images. As shown in FIG. 2B, second virtual images (hereinbelow, referred to as "second virtual images") 8B of the needle points based on the second photographed images are displayed on the second image data area of the monitor screen 9A.

The second photographed image of the needle point of each probe 8A has a pin-point size, so it is small. Accordingly, the second virtual image 8B can be displayed as an image obtained by enlarging the second photographed image. When the second photographed image of the probe 8A is large, it can be displayed in reduced dimension suitable for alignment. On the monitor screen 9A, the X and Y coordinate values are displayed in conformity with the position coordinates in the prober chamber 2. The second virtual images 8B are displayed, together with the X and Y coordinates correctly adjusted. In FIG. 2B, the second virtual images 8B are arranged slightly zigzag. Although it is ideal that the ends of the probes are arranged linearly as designed, the ends of the probes are arranged zigzag under the manufacturing conditions and using conditions of the probe card.

Figure 5B:
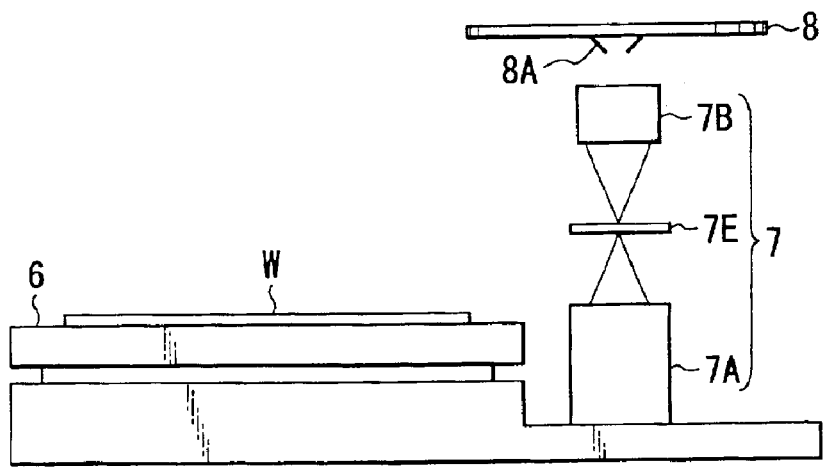
Figure 5C:
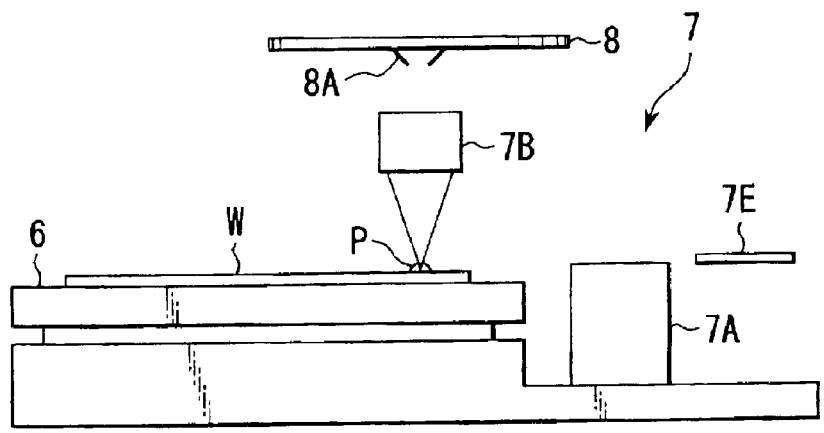
Figure 6A:
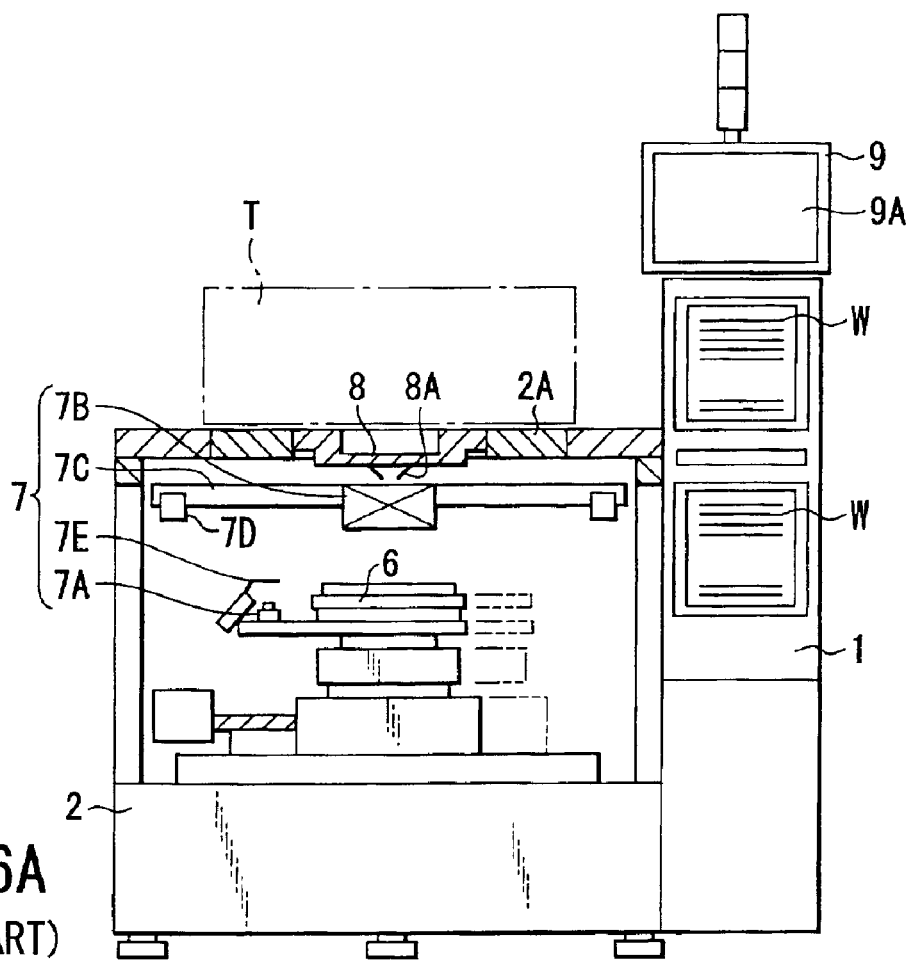
FIGS. 6A and 6B are diagrams showing a probe apparatus, FIG. 6A being an exploded front view of the probe apparatus and FIG. 6B being a plan view schematically showing the internal portion of the apparatus shown in FIG. 6A.
Figure 6B:
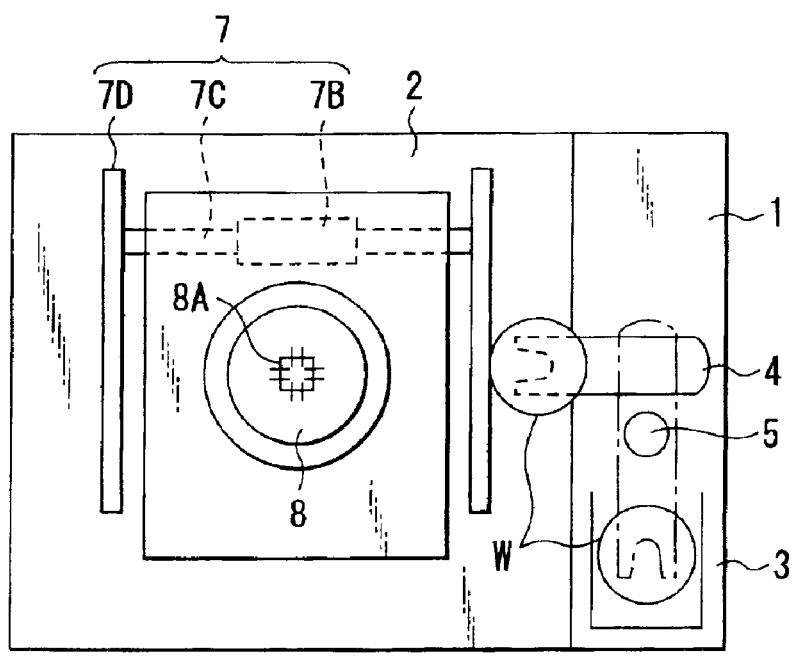

The optical axis of the upper CCD camera 7B is allowed to match the optical axis of the lower CCD camera 7A as shown in FIG. 5B and the matching position is obtained. In other words, the wafer W received from the fork 4 (FIG. 6B) of the loader chamber 1 (FIG. 6A) is set on the main chuck 6. The alignment bridge 7C is moved to the range between the main chuck 6 and the probe card 8 and is then stopped in a probe center portion below the probe card 8. The target 7E advances over the lower CCD camera 7A. The lower CCD camera 7A focuses the center of the target 7E to recognize a metal thin film. The upper CCD camera 7B focuses the center of the target 7E to recognize the metal thin film. According to the above operation, the optical axis of the lower CCD camera 7A matches the optical axis of the upper CCD camera 7B. The intersection of the focal plane and the optical axis at that time is calculated on the basis of the position of the main chuck 6. The position denotes a reference position (X, Y, Z) for alignment and can be registered in a storage unit (not shown). Furthermore, the amount of movement of the main chuck 6 at that time is detected through, for example, an encoder.

After that, the center and diameter of the wafer W are obtained by using the upper CCD camera 7B. The target 7E is moved backward from the focal plane of the lower CCD camera 7A. While the main chuck 6 is moved, the upper CCD camera 7B detects, for example, the predetermined three ends on the wafer W. Due to the detection, the distance traveled by the main chuck can be obtained. The center and diameter of the wafer W are calculated on the basis of the above detection results. The calculation values are registered in the storage unit. Subsequently, the upper CCD camera 7B views a scribing line on the wafer W and also rotates the wafer W in the θ direction. According to the direction, the device formed on the wafer W is aligned with the indexing direction.

While the main chuck 6 is moved, the upper CCD camera 7B photographs the wafer W on the main chuck 6. The photographed image is compared with a previously registered image in a register device for alignment. As a result of the comparison, the photographed image which matches the image in the register device for alignment is extracted. After the photographed image matching the image in the register device is extracted, on the basis of design data of the image in the register device, first virtual images P' of predetermined electrode pads are displayed in the first image data area on the monitor screen 9A as shown in FIG. 2A. The displayed predetermined electrode pads can be set to a part or all of the electrode pads on the device. When the design data is not used, the first virtual images P' can be also subjected to the same processing as that for the second virtual images of the probes and then displayed on the basis of photographing data obtained by photographing the electrode pads of the corresponding device on the wafer W through the CCD camera 7B.

The arrangement of the first virtual images P' corresponds to the arrangement of the second virtual images 8B of the probes. The arrangement of the first virtual images P' is precisely displayed on the basis of the reduced X and Y coordinates. As shown in FIGS. 2A and 2B, on the monitor screen 9A, the first image data area in which the first virtual images P' of the electrode pads are displayed and the second image data area in which the second virtual images 8B of the probes are displayed can be arranged so as to be adjacent to each other in the X and Y directions. The X and Y coordinate values of the first image data area to display the first virtual images P' and those of the second image data area to display the second virtual images 8B can be set discontinuously.

Figure 3:
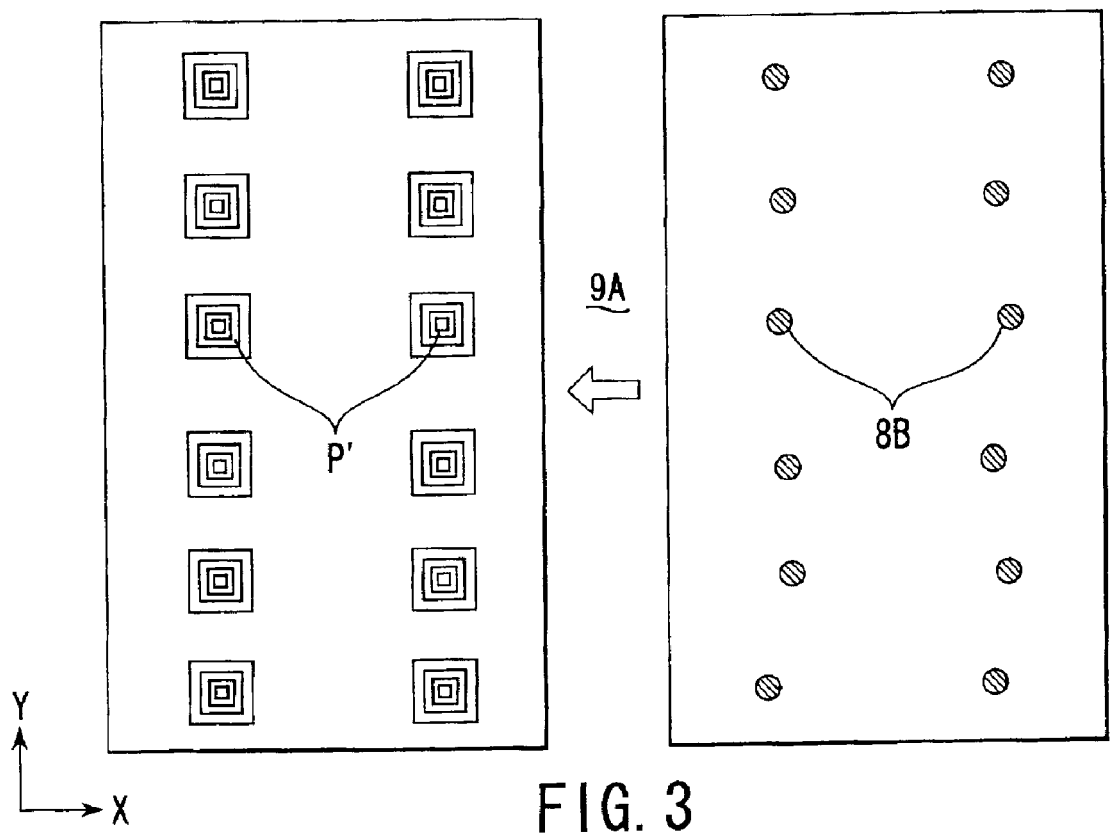
FIG. 3 shows an example of the monitor screen showing a state where dark and light colors (color having distributed densities) are applied to the virtual images shown in FIGS. 2A and 2B.
Figure 4:
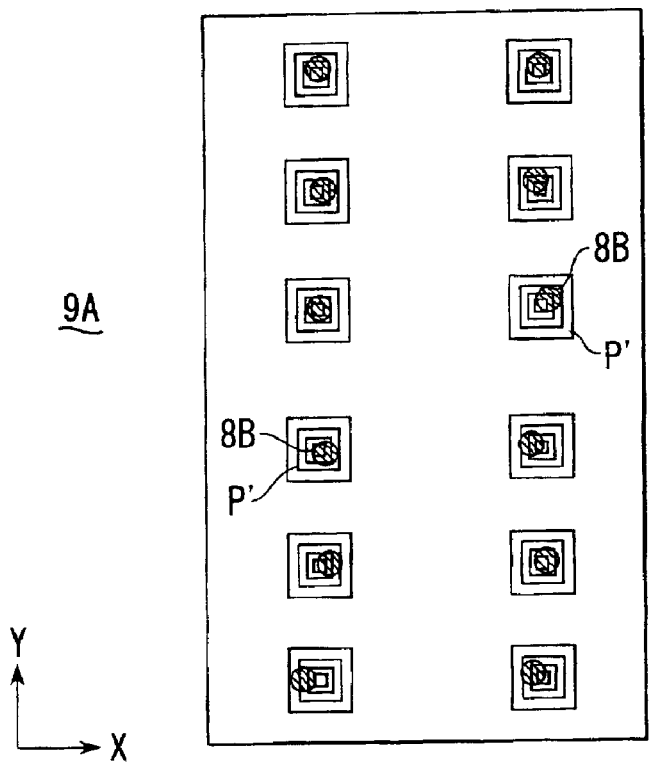
FIG. 4 is a view showing a state where the second virtual images of the probes shown in FIG. 3 are moved to be superimposed on the first virtual images of the electrode pads.

According to the present embodiment, the second virtual images 8B and the first virtual images P' do not merely denote the probe ends and the electrode pads. The first and second virtual images can be colored. For example, as shown in FIG. 3, preferably, dark and light colors (color having distributed densities) are applied to the first virtual images P'. As shown in FIG. 3, a color having a uniform density (e.g., black that is darkest) can be applied to all the pixels constituting the second virtual images 8B of the probes. In the first virtual images P' of the electrode pads, the brightness can be stepwise changed from the center to the outside. For example, the first virtual image P' can be shown in such a manner that the pixels at the center thereof are brightest, the surrounding pixels are stepwise darkened from the center to the outside, and the pixels on the outer periphery are darkest. As for the colors of the first and second virtual images, the density of one color can be uniformed and the density of the other color can be distributed. In consideration of the sizes of the display area of each first virtual image and that of each second virtual image, the color density (distribution) can be properly selected.

Referring to FIG. 3, the second virtual images 8B are displayed by hatching and the first virtual images P' are displayed without gradation.

According to the present embodiment, as shown in FIG. 3, the second virtual images 8B are moved on the monitor screen 9A in the direction shown by an arrow, so that the second virtual images 8B can be superimposed on the first virtual images P'. As each of the second virtual images 8B is superimposed on each of the first virtual images P', the bright portion of the first virtual image P' is covered with the second virtual image 8B that is black. Consequently, the luminance of the first virtual image P' is stepwise darkened. The luminance can be detected by calculating the total sum of the brightnesses (luminances) of all of the first virtual images P'. Alternatively, the luminance can be detected by calculating the total sum of the brightnesses (luminances) in the whole screen of the first image data area. Alternatively, the luminance can be detected by calculating the mean value of the luminance of the first virtual image P' and the luminance of the peripheral portion.

A position where each target probe 8A is most successfully aligned with each target electrode pad P can be grasped as a position where the lowest luminance regarding the first virtual image P' is obtained. Alternatively, the position where each target probe 8A is most successfully aligned with each target electrode pad P can be grasped as a position where the luminance of the first virtual image P' is most changed. Alternatively, the position where each target probe 8A is most successfully aligned with each target electrode pad P can be grasped by detecting the fact that the luminance regarding the first virtual image P' is set to a predetermined value. Alternatively, the position where each target probe 8A is most successfully aligned with each target electrode pad P can be grasped by detecting the fact that the luminance regarding the first virtual image P' is set to the maximum value or minimum value. The most successful alignment of the target probes 8A and the target pads may also be confirmed by observing the monitor screen 9A with the unaided eye.

In order to set each of the target probes 8A and each of the target electrode pads P to the most successful contact position, a distance relatively traveled by the second virtual images 8B and the first virtual images P' in the X and Y directions is obtained. This distance corresponds to a distance where the main chuck 6 should be moved to align the electrode pads with the probes. The distance to be moved can be registered in the storage unit of the control device.

The main chuck 6 is moved in the X and Y directions by the distance to be moved, so that the positions of the electrode pads on the wafer W match the positions of the needle points of the probes 8A. After the positions of the target probes 8A match those of the target pads P, the main chuck 6 is moved so that an object (device) to be first inspected is located just below the probe card 8. The main chuck 6 is moved upward in the Z direction and is then overdriven, so that the first device is set in a state where the electric characteristics thereof can be inspected. After the inspection, the main chuck 6 is moved downward. The indexing of the wafer W is repeated to sequentially inspect the devices.

As described above, according to the first embodiment, the lower and upper CCD camera 7A and 7B photograph the target probes 8A and the target pads P. The first virtual images P' and the second virtual images 8B are displayed in the first and second image data areas on the monitor screen 9A. The first virtual images P' and the second virtual images 8B are colored. The second virtual images 8B or first virtual images P' are moved on the monitor screen 9A, so that the virtual images are superimposed on the other virtual images. The total sum of the brightnesses (luminances) of the virtual images is measured. On the basis of the luminance value, the position where the target probes 8A are most successfully aligned with the target pads P is grasped. In the above embodiment, complicated calculations for alignment, which have been required so far, are not needed. The target probes 8A can be simultaneously aligned with the corresponding target pads P without complicated numerical calculation. The alignment situation can be visually confirmed on the monitor screen 9A. The throughput of the inspection can be raised.

In the above embodiment, the dark and light colors are applied to the first virtual images P' so that the color is stepwise darkened from the inside to the outside. The darkening from the outside to the inside is also acceptable. Each second virtual image P' is colored black. The image can be unhatched. Alternatively, dark and light colors can also be applied to the image. At least two dark and light colors can be used. Various colors including black can be used. The coloring processing of the first virtual image P' and the second virtual image 8B can be performed in a manner reverse to the above description.

A second embodiment of the present invention will now be described with reference to FIGS. 7A to 8C. According to the first embodiment, the color having a uniform density or color having distributed densities is applied to the first and second virtual images on the monitor screen 9A. The second embodiment relates to an improvement of the technique of coloring the virtual image. According to the second embodiment, the application of the dark and light colors or the density distribution is changed, so that an arbitrary contact state of the first and second virtual images can be detected. FIGS. 7A to 7C show examples in which first objects denote electrode pads and second objects denote probes. FIG. 7A shows virtual images of the electrode pads. FIG. 7B shows virtual images of the probes. The density of a color applied to each virtual image shown in FIG. 7A is gradually lowered from the left-hand side to the right-hand side. The density is shown as a concentrically distributing state on the right-hand side. A color having a uniform high density is applied to the virtual image of each probe in FIG. 7B.

The virtual images of the electrode pads in FIG. 7A are moved in the direction toward the virtual images of the probes in FIG. 7B to superimpose the images on the other images and the density of the electrode pad is simultaneously measured. When the highest density is obtained, as shown in FIG. 7C, the virtual images of the probes are aligned with the center portions of the virtual images of the electrode pads, the center portions being located on the right-hand side.

As mentioned above, the dark and light virtual images shown in FIGS. 7A and 7B are used, so that the probes can be aligned with the right-hand side portions of the electrode pads.

Another example will now be described with reference to FIGS. 8A to 8C. FIG. 8A shows the virtual images of the electrode pads and FIG. 8B shows the virtual images of the probes, respectively. The same dark and light colors as those in FIG. 7A are applied to the virtual image drawn in the upper portion in FIG. 8A. A color having distributed densities obtained by reversing the upper virtual image from left to right is applied to the virtual image drawn in the lower portion in FIG. 8B. The upper virtual image shown in FIG. 8B is located on the right-hand side and the lower virtual image is located on the left-hand side.

The virtual images of the electrode pads in FIG. 8A are moved in the direction toward the virtual images of the probes in FIG. 8B to superimpose the virtual images on the other virtual images and the density of each electrode pad is simultaneously measured. When the highest density is obtained, as shown in FIG. 8C, the virtual images of the probes are aligned with the center portions of the virtual images of the electrode pads, the center portions being located on the right-hand side.

As mentioned above, when the dark and light virtual images shown in FIG. 8A are used, it is possible to align the probes, which are designed so that the probes are brought into contact with the electrode pads in the different positions as shown in FIG. 8B, with the predetermined electrode pads.

A third embodiment of the present invention will now be described. The present embodiment relates to a method for detecting the superimposing state of the first and second objects. As in the first embodiment, the second virtual images 8B are moved in the direction shown by the arrow on the monitor screen 9A to superimpose the second virtual images on the first virtual images. As the second virtual images 8B are superimposed on the first virtual images P', the bright portion of each first virtual image P' is covered with the second virtual image 8B which is black. Consequently, the luminance of the first virtual image P' is stepwise darkened. The luminance is changed in accordance with the degree of superimposition of the first and second virtual images. The third embodiment relates to a method for detecting the superimposing state of the two objects on the basis of the luminance value. Similar to the first embodiment, the luminance can be detected by calculating the brightness (luminance) of the portion where both the virtual images are superimposed on each other on the monitor screen.

A fourth embodiment relates to a method for inspecting whether all the probes of the probe card are arranged in the correct positions by using the method according to the third embodiment. In other words, in the fourth embodiment, the first objects are set to a plurality of reference marks arranged in predetermined positions on a substrate and the second objects are set to a plurality of probes of the probe card. In the fourth embodiment, the second virtual images of the probes are superimposed on the first virtual images of the reference marks. The superimposing state can be grasped by measuring the luminance of the superimposing portion. For example, when the probes include a probe arranged in a position deviated from the predetermined position, the measured luminance denotes a value that is different from the essential luminance value. As mentioned above, when the luminance is measured, the presence or absence of the probe, which is located in the position deviated from the predetermined position, among the probes can be detected.

In the above embodiments, the case where the present invention was applied to the alignment in the probe apparatus has been described. However, the present invention can also be applied to the other aligning methods. In this case, the shapes of the first and second objects can be set according to the respective objects and design data.

What is claimed is:

1. A method for moving a main chuck on which first objects are set in X, Y, Z, and θ directions to align the first objects with second objects arranged above the first objects, the method comprising:

(a) photographing the second objects through second photographing means to obtain second photographed images;

(b) displaying second virtual data images in a second image data area on a monitor screen of a display device on the basis of the second photographed images of the second objects;

(c) allowing an optical axis of the second photographing means to match an optical axis of first movable photographing means to obtain a reference position of the main chuck;

(d) moving the main chuck to align the first objects with the first photographing means and then photographing the first objects through the first photographing means to obtain first photographed images;

(e) displaying first virtual data images of the first photographed images in a first image data area on the monitor screen of the display device on the basis of design data of the first objects;

(f) relatively moving the first virtual data images and the second virtual data images on the monitor screen to superimpose both the virtual data images on each other;

(g) determining a position where both the virtual data images are most fitly superimposed on each other as an alignment position of the first and second objects;

wherein the first objects are a plurality of electrode pads formed on an object to be inspected and the second objects are a plurality of contactors to be electrically brought into contact with the electrode pads; and wherein:

in (b), the second virtual data images of the contactors are displayed with a color having a uniform density, in (d), the electrode pads to be photographed by the first photographing means are reference electrodes for alignment among the plurality of electrode pads formed on the object to be inspected, in (e), the first virtual data images of the electrode pads are displayed with dark and light colors, and in (f), a position where an image density is most changed due to the superimposition of the first virtual data image and the second virtual data image is set to a position where both the virtual data images are superimposed on each other so that both the images are most fitly superimposed on each other.

2. A method for aligning a plurality of electrode pads arranged on an object to be inspected with a plurality of contacts formed on a probe card, the method comprising:

(a) photographing predetermined electrode pads among the electrode pads through first photographing means to obtain first photographed images;

(b) displaying first virtual data images corresponding to the predetermined electrode pads in a first image data area on a monitor screen of a display device on the basis of the first photographed images and design data of the predetermined electrode pads, the first virtual data images being colored and the color denoting either of a color having a uniform density and a color having a distributed density;

(c) photographing the contactors through second photographing means to obtain second photographed images;

(d) displaying second virtual data images of the contactors corresponding to the second photographed images in a second image data area on the monitor screen of the display device, the second virtual data images being colored and the color denoting either of a color having a distributed density and a color having a uniform density;

(e) relatively moving the first virtual data images and the second virtual data images on the monitor screen to superimpose both the virtual data images on each other and then measuring the luminance of each portion where both the virtual data images are superimposed on each other;

(f) detecting a superimposing state of the first virtual data image and the second virtual data image on the basis of the luminance measured in the (e);

(g) detecting a distance relatively traveled by both the virtual data images until the superimposition of the first virtual data images and the second virtual data images is set to a predetermined state according to (f); and (h) relatively moving the electrode pads and the contactors on the basis of the traveled distance to align the pads with the contactors.

3. The method according to claim 2, wherein in (e), the luminance to be measured is a change in luminance.

4. The method according to claim 2, wherein in (f) the superimposing state of the first virtual data images and second virtual data images is detected on the basis of a comparison of the measured luminance with a predetermined luminance value.

5. The method according to claim 2, wherein in (f), the superimposing state of the first virtual data images and the second virtual data images is grasped on the basis of a detection result indicating that the measured luminance denotes one of a maximum value and a minimum value.

6. The method according to claim 2, wherein in (d), each second virtual data image formed in the second image data area is one of an image obtained by enlarging a photographed image of each contactor and an image obtained by reducing the photographed image.

7. The method according to claim 2, wherein the predetermined electrode pads in (a) are all of the electrode pads on the object to be inspected, and the contractors in (c) are the contactors corresponding to all of the electrode pads.

8. The method according to claim 2, wherein the predetermined electrode pass among the electrode pads in (a) are reference electrodes for alignment.

9. A method for detecting a superimposing state of first objects and second objects arranged so as to face the first objects, the method comprising:

(a) photographing the first objects through first photographing means to obtain first photographed images;

(b) forming first virtual data images corresponding to the first objects in a first image data area on a monitor screen of a display device on the basis of the first photographed images and design data of the first objects, the first virtual data images being colored and the color denoting either of a color having a uniform density and a color having a distributed density;

(c) photographing the second objects through second photographing means to obtain second photographed images;

(d) forming second virtual data images corresponding to the second objects in a second image data area on the monitor screen of the display device on the basis of the photographed images of the second objects, the second virtual data images being colored and the color denoting either of a color having a distributed density and a color having a uniform density;

(e) relatively moving the first virtual data images and the second virtual data images on the monitor screen to superimpose both the virtual data images on each other and then measuring the luminance of each superimposing portion; and (f) detecting a superimposing state of the first virtual data images and the second virtual data images on the basis of the luminance value measured in the (e).

10. The method according to claim 9, wherein the first objects are a plurality of reference marks arranged in predetermined positions on a substrate and the second objects are a plurality of contact formed on a probe card.

11. An apparatus for moving a main chuck on which first objects are set in X, Y, Z, and θ directions to align the first objects with second objects arranged above the first objects, the apparatus comprising:

second photographing means for photographing the second objects to obtain second photographed images;

means for displaying second virtual data images in a second image data area on a monitor screen of a display device on the basis of the second photographed images of the second objects;

means for allowing an optical axis of the second photographing means to match an optical axis of first movable photographing means to obtain a reference position of the main chuck;

means for moving the main chuck to align the first objects with the first photographing means and then allowing the first photographing means to photograph the first objects to obtain first photographed images;

means for displaying first virtual data images of the first photographed images in a first image data area on the monitor screen of the display device on the basis of design data of the first objects;

means for relatively moving the first virtual data images and second virtual data images on the monitor screen to superimpose both the virtual data images on each other; and means for determining a position where both the virtual data images are most fitly superimposed on each other as an alignment position of the first and second objects;

wherein the first objects are a plurality of electrode pads formed on an object to be inspected and the second objects are a plurality of contacts to be electrically brought into contact with the electrode cads; and wherein:

the second virtual data images are displayed with a color having a uniform density, the electrode pads photographed by the first photographing means are reference electrodes for alignment among the electrode pads formed on the object to be inspected, the first virtual data images of the electrode pads are displayed with dark and light colors, and the superimposing means determines a position where an image density is most changed due to the superimposition of the first virtual data images and the second virtual data images as a position where both the virtual data images are superimposed on each other so that both the images are most fitly superimposed on each other.

12. An apparatus for aligning a plurality of electrode pads arranged on an object to be inspected with a plurality of contactors formed on a probe card, the apparatus comprising:

first photographing means for photographing predetermined electrode pads among the electrode pads to obtain first photographed images;

means for displaying first virtual data images corresponding to the predetermined electrode pads in a first image data area on a monitor screen of a display device on the basis of the first photographed images and design data of the predetermined electrode pads, the first virtual data images being colored and the color denoting either of a color having a uniform density and a color having a distributed density;

second photographing means for photographing the contactors to obtain second photographed images;

means for displaying second virtual data images of the contactors corresponding to the second photographed images in a second image data area on the monitor screen of the display device, the second virtual data images being colored and the color denoting either of a color having a distributed density and a color having a uniform density;

means for relatively moving the first virtual data images and the second virtual data images on the monitor screen to superimpose both the virtual data images on each other and then measuring the luminance of a portion where both the virtual data images are superimposed on each other;

means for detecting a superimposing state of the first virtual data images and the second virtual data images on the basis of the measured luminance;

means for detecting a distance relatively traveled by both the virtual data images until the superimposition of the first virtual data images and the second virtual data images is set to a predetermined state by the means for detecting the superimposing state; and means for relatively moving the electrode pads and the contactors on the basis of the traveled distance to align the pads with the contactors.

13. The apparatus according to claim 12, wherein the luminance measured by the means for measuring the luminance is a change in luminance.

14. The apparatus according to claim 12, wherein the means for detecting the superimposing state detects the superimposing state on the basis of a comparison of the measured luminance with a predetermined luminance value.

15. The apparatus according to claim 12, wherein the means for detecting the superimposing state grasps the superimposing state of the first virtual data images and the second virtual data images on the basis of a detection result indicating that the measured luminance denotes one of a maximum value and a minimum value.

16. The apparatus according to claim 12, wherein each second virtual data image formed in the second image data area through the displaying means is one of an image obtained by enlarging a photographed image of each contactor and an image obtained by reducing the photographed image.

17. The apparatus according to claim 12, wherein the predetermined electrode pads photographed by the first photographing means are all of the electrode pads on the object to be inspected, and the contactors photographed by the second photographing means are the contactors corresponding to all of the electrode pads.

18. The apparatus according to claim 12, wherein the electrode pads photographed by the first photographing means are reference electrodes for alignment.

19. An apparatus for detecting a superimposing state of first objects and second objects arranged so as to face the first objects, the apparatus comprising:

first photographing means for photographing the first objects to obtain first photographed images;

means for forming first virtual data images corresponding to the first objects in a first image data area on a monitor screen of a display device on the basis of the first photographed images and design data of the first objects, the first virtual data images being colored and the color denoting either of a color having a uniform density and a color having a distributed density;

second photographing means for photographing the second objects to obtain second photographed images;

means for forming second virtual data images corresponding to the second objects in a second image data area on the monitor screen of the display device on the basis of the photographed images of the second objects, the second virtual data images being colored and the color denoting either of a color having a distributed density and a color having a uniform density;

means for relatively moving the first virtual data images and the second virtual data images on the monitor screen to superimpose both the virtual data images on each other and then measuring the luminance of each superimposing portion; and means for detecting a superimposing state of the first virtual data images and the second virtual data images on the basis of the measured luminance value.

20. The apparatus according to claim 19, wherein the first objects are a plurality of reference marks arranged in predetermined positions on a substrate and the second objects are a plurality of contacts formed on a probe card.

21. An apparatus for moving a main chuck on which a first object is set in X, Y, Z, and θ directions to align the first object with second objects arranged above the first object, the apparatus comprising:

first photographing means for photographing the first object;

second photographing means for photographing the second objects;

first image forming means for forming image data of the first object on the basis of data obtained by the first photographing means;

second image forming means for forming image data of the second objects on the basis of data obtained by the second photographing means;

dark and light portions applying means for applying dark and light portions to the image data formed by the first and second image forming means;

means for relatively moving the image data of the first object and the image data of the second objects, to which the dark and light portions are applied by the dark and light portions applying means, to superimpose both the images on each other;

luminance detecting means for detecting at least one of a position having the lowest luminance and a position having the highest luminance on the basis of the luminance of the images superimposed by the superimposing means; and aligning means for aligning the first object with the second objects by moving both the objects on the basis of the detection result obtained by the luminance detecting means.

22. The apparatus according to claim 21, wherein the first object is a wafer, first images are a plurality of electrode pads formed on the wafer, and the second objects are a plurality of probes to be come into contact with the electrode pads.

23. A method for moving a main chuck on which a first object is set in X, Y, Z, and θ directions to align the first object with second objects arranged above the first object, the method comprising:

(a) photographing the first object;

(b) photographing the second objects;

(c) forming image data of the first object on the basis of photographing data of the photographed first object;

(d) forming image data of the second objects on the basis of photographing data of the photographed second objects;

(e) applying dark and light portions to images of the first and second image data;

(f) relatively moving the image data of the first object and the image data of the second objects, to which the dark and light portions are applied, to superimpose both images on each other;

(g) detecting at least one of a position having the lowest luminance and a position having the highest luminance on the basis of the luminance of the superimposed images; and (h) moving the first object and the second objects on the basis of the detected luminance value to align both the objects with each other.

24. The method according to claim 23, wherein the first object is a wafer, the first images are a plurality of electrode pads formed on the wafer, and the second objects are a plurality of probes to be come into contact with the electrode pads.

* * * * *